United States Patent
Wang et al.

(10) Patent No.: US 7,525,360 B1
(45) Date of Patent: Apr. 28, 2009

(54) I/O DUTY CYCLE AND SKEW CONTROL

(75) Inventors: Xiaobao Wang, Cupertino, CA (US);
Chiakang Sung, Milpitas, CA (US);
Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/735,401

(22) Filed: Apr. 13, 2007

Related U.S. Application Data

(60) Provisional application No. 60/793,864, filed on Apr. 21, 2006.

(51) Int. Cl.
*H03K 3/017* (2006.01)

(52) U.S. Cl. .................................. 327/175; 327/172

(58) Field of Classification Search .................. None
See application file for complete search history.

(56) References Cited

U.S. PATENT DOCUMENTS

| | | | | |
|---|---|---|---|---|
| 6,469,565 B1* | 10/2002 | Lee | ............................... | 327/374 |
| 6,791,360 B2* | 9/2004 | Gauthier et al. | ................ | 326/93 |
| 6,791,888 B2* | 9/2004 | Kang | .......................... | 365/193 |
| 7,142,026 B2* | 11/2006 | Kwak | .......................... | 327/158 |
| 7,230,464 B2* | 6/2007 | Rashid | ........................ | 327/175 |

* cited by examiner

*Primary Examiner*—Cassandra Cox
(74) *Attorney, Agent, or Firm*—Townsend and Townsend and Crew LLP; David B. Raczkowski

(57) ABSTRACT

Circuits, methods and apparatus are provided to control the duty cycle of a signal. The rising and falling edges of a signal can be delayed independently to provide the selection or tuning of the duty cycle of the signal. Additionally, the delays can be used to reduce skew among both edges of signals being provided or transmitted by a data interface. The delays can be made to not cause a high-Z during a transition of the signal.

20 Claims, 7 Drawing Sheets

I/O DUTY CYCLE AND SKEW CONTROL

CROSS-REFERENCES TO RELATED APPLICATIONS

This application claims the benefit of U.S. Provisional Application No. 60/793,864 filed Apr. 21, 2006, entitled "Write-Side Calibration," by Yan Chong et al., the disclosure of which is incorporated herein by reference in its entirety.

This application is related to U.S. provisional patent application No. 60/793,838 filed Apr. 21, 2006, entitled "A Read Side Calibration Scheme to Improve Read Timing Margin for External Memory Interface Applications in FPGA Devices," by Yan Chong et al.; to concurrently filed and commonly owned U.S. patent application "Read-Side Calibration for Data Interface" by Yan Chong et al. Ser. No. 11/735,386; and to concurrently filed and commonly owned U.S. patent application "Write-Side Calibration for Data Interface" by Yan Chong et al. Ser. No. 11/735,934, which are incorporated by reference for all purposes.

BACKGROUND

The present invention relates to high-speed data interfaces, and more particularly to controlling the duty cycle and skew of input/output signals provided by high-speed data interfaces.

The demand for higher speed data interfaces has increased dramatically in the past few years, and this increase shows no signs of abating. As an example, huge amounts of data must be transferred to/from memory devices to other integrated circuits for such applications as music and video playback, image processing, graphics, and others. Many of these demanding applications run on advanced field programmable gate arrays (FPGAs) such as those developed by Altera Corporation of San Jose, Calif.

New interface techniques, such as Double data rate (DDR) and others, have been developed to support these data rates. In a DDR interface, data is read on each (rising and falling) edge of a strobe or clock signal. Output signals for DDR memory interfaces include a data strobe (DQS) signal that is transmitted along with a group of data (DQ) signals that are captured or received by a receiver on a second interface. Typically, when data is being transmitted from the FPGA (i.e. data is being written), the DQS signal is center aligned with the data signals to ensure accurate receipt of the data; and when the data is received, the DQS signal is edge aligned with the data signals.

Since data is read on each edge of the DQS signal, the timing margins at these interfaces are greatly reduced. For future DDR memory devices that target the 800 Mbs to 1 Gbs data rate ranges, the timing budget left for errors caused by the memory controller becomes quite demanding. This demand places a strict burden on the FPGA transmitting circuitry, and may be compounded by environmental effects on the device during operation. To improve this write timing margin and center alignment of the DQS signal with the data signals, it is important to reduce skew between the signals. Additionally since data is transmitted on each edge of a strobe or clock signal, it is important to reduce skew among both edges of the signals and to control a duty cycle of the signals.

Accordingly, what is needed are circuits, methods, and apparatus that reduce skew among input/output signals, at both edges, and that controls the duty cycle of the input/output signals. For example, what is needed are circuits, methods, and apparatus that reduce skew among the DQ and DQS signals at a data interface, such as a data interface on an FPGA device.

BRIEF SUMMARY OF THE INVENTION

Embodiments of the present invention provide circuits, methods and apparatus that can control the duty cycle of a signal and can reduce skew among both edges of signals being provided or transmitted by a data interface. The rising and falling edges of a signal can be delayed independently to provide the selection or tuning of the duty cycle of the signal. For example, a signal may not be delayed, have both rising and falling edges of the signal, have only the rising edges of the signal, or have only the falling edges of the signal. In one aspect, the delays do not cause a high-Z during a transition of the signal.

According to one exemplary embodiment, an integrated circuit has a duty cycle control circuit. The duty cycle control circuit receives an input signal that is then sent without any appreciable delay to one input of a signal selection circuit. The input signal is also sent to a delay chain that has an output coupled with a second input of the signal selection circuit. A first logic also receives the input signal and sends an output to a third input of the signal selection circuit. Only the rising edges of the input signal are delayed in the output of the first logic. A second logic also receives the input signal and sends an output to a fourth input of the signal selection circuit. Only the falling edges of the input signal are delayed in the output of the second logic.

In one embodiment, the first logic provides an AND function. The first logic may receive a delayed signal from the delay chain or from another delay chain for providing the delay of on the rising edges. In another embodiment, the second logic provides an OR function. In one aspect, the first logic is an AND gate and the second logic is an OR gate. The second logic may also have a second input coupled with an output of the delay chain or another delay chain.

In one embodiment, the delay chain is programmable, and thus multiple discrete or continuous delay values are accessible. The delay values may be selected by control signals sent from adjustment control adjustment circuitry in the integrated circuit. In another embodiment, the duty cycle control circuit resides within a data interface of a field programmable gate array.

In one embodiment, the output signal of the signal selection circuit, such as a mux, is transmitted to an output buffer. Control signals at a signal select input may be used to determine which signal to output from the mux. The control signals may be derived from configuration bits stored in a memory element. In another embodiment, the input signal at the duty cycle control circuit is an input signal at a data interface.

According to another exemplary embodiment, an integrated circuit has an I/O bank. The I/O bank includes a pull-up device; a pull-down device; and a duty cycle control circuit. The duty cycle can receive a signal and either not delay the signal, delay both rising and falling edges of the signal, delay only the rising edges of the signal, or delay only the falling edges of the signal. A resultant signal, taken from one of the above delay options, is transmitted at an output. The output of the duty cycle control circuit is coupled with an input of the pull-up device and an input of the pull-down device.

In one embodiment, the duty cycle control circuit receives one or more control signals from skew adjustment control circuitry that resides in a same integrated circuit as the duty cycle control circuit. In another embodiment, the input/output bank does not cause a high-Z state when either only the rising edges of the signal are delayed or only the falling edges of the signal are delayed.

A better understanding of the nature and advantages of the present invention may be gained with reference to the following detailed description and the accompanying drawings.

DETAILED DESCRIPTION OF THE INVENTION

Embodiments of the present invention provide circuits, methods and apparatus that can control the duty cycle of a signal and can reduce skew among both edges of signals being provided or transmitted by a data interface. Delays of the rising and falling edges of a signal are independently controlled to provide the selection or tuning of the duty cycle. In one aspect, the delays do not cause a high-Z during a transition of the signal. This duty cycle and skew control facilitates using new and faster memory interfaces. While specific embodiments of the present invention are well suited to DDR interfaces on FPGA devices, other types of interfaces and other types of devices (e.g., an ASIC) and circuits may be improved by the incorporation of an embodiment of the present invention.

Figure 1:
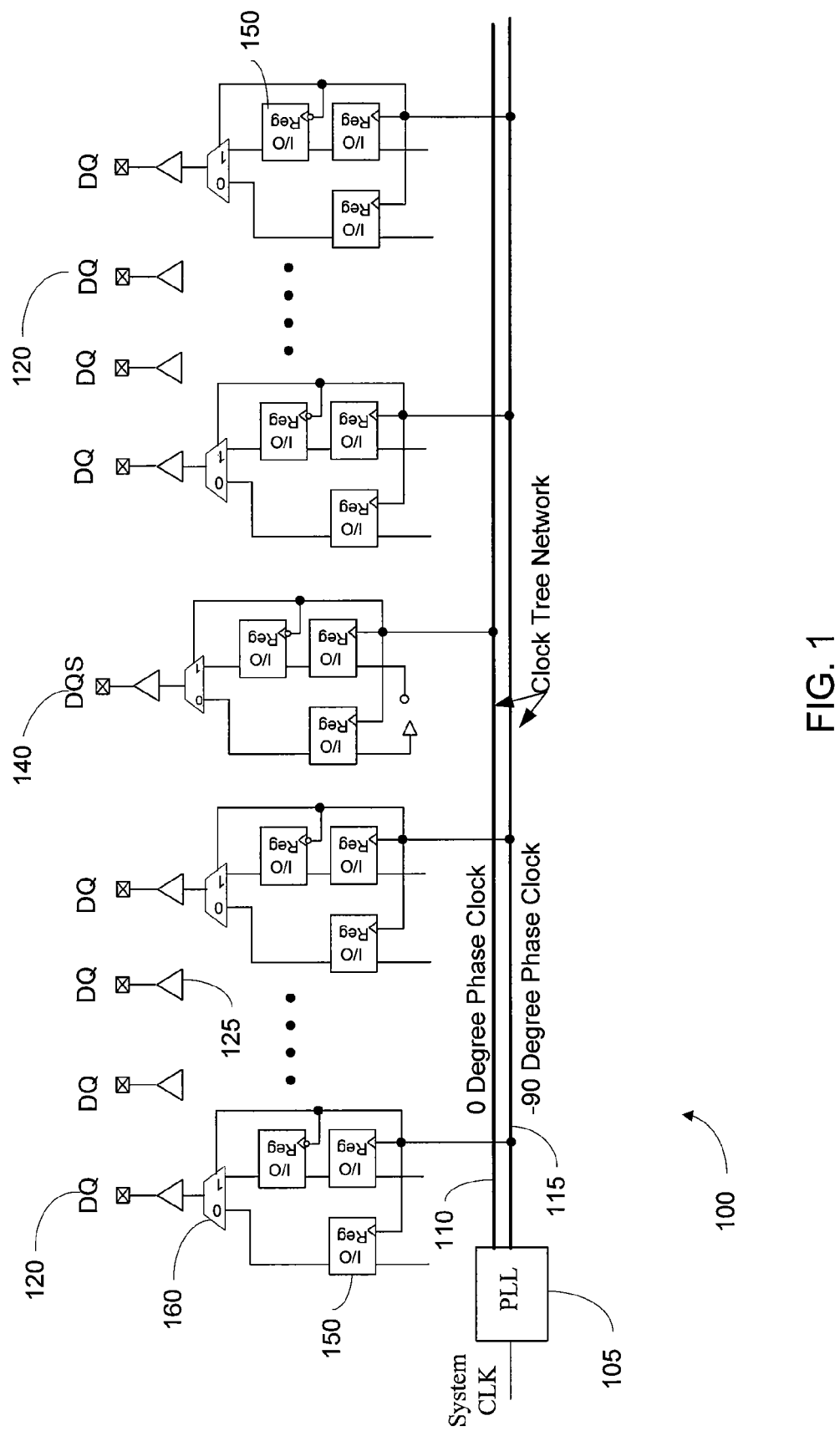
FIG. 1 is a block diagram of a data interface according to an embodiment of the present invention.

FIG. 1 is a block diagram of a data interface 100 according to an embodiment of the present invention. During a write operation, data interface 100, such as a DDR interface on an FPGA, provides or transmits DQ 120 and DQS 140 signals to a memory device (not shown). These DQS and DQ signals are center aligned, that is, rising and falling edges of the DQS signal are aligned with the centers of data bits of the DQ signals. The DQS signal can then be used inside the memory device to capture the DQ signals. This block diagram illustrates circuitry for one DQ/DQS group of signals having 8 DQ signals 120 and one DQS signal 140. For a 72-bit DDR memory interface, there would be nine×8 DQ/DQS groups. Embodiments of the present invention are also applicable to the input side of a data interface, as disclosed in U.S. patent application "Read-Side Calibration for Data Interface" by Yan Chong et al. Ser. No. 11/735,386.

A balanced clock tree structure is introduced as a reference signal used to align signals in the DQ and DQS output path. A phase-locked loop (PLL) 105 generates clock signals 110, 115 at right angles to each other. In this example, clock signal 110 is at a zero degree phase and clock signal 115 is at a negative 90 degree phase. The zero degree phase clock 110 is used to generate DQS, and the negative 90 degree phase clock 115 is used to generate the DQ signals. The clock signals 115 trigger output of the data signals from DDR output registers 150, and multiplexer (mux) 160 combines the data signals to form a DDR output signal.

When arranging a clock tree structure, a balanced structure with minimum skew is desired as it is used as a matching reference. For example, one clock tree covering the whole 72-bit memory interface typically has more clock skew than a shorter clock tree that covers only one×8 DQ/DQS group. Even when care is taken to match signal paths and device sizes, matching errors, such as differences in transistor sizes in different signal paths, can cause skew and timing mismatches. Accordingly, embodiments of the present invention adjustably vary rising and/or falling edge delays provided by elements inserted in the paths of output signals, as well as of input signals, of data interface 100 to align the signals. After an edge alignment, the center alignment can be obtained via the two clocks 110, 115.

Besides adjusting the skew of I/O signals, it is desirable to control the output duty cycle of signals, especially the clock pins and DQS pins in a high speed DDR memory interface design. This control may be to adjust the signal duty cycle to 50 percent, or to deskew the outputs as described above. For example, if the frequency is 500 Mhz, and the skew between the rising edge and falling edge from the FPGA output buffer is 100 ps, then the duty cycle is 45% or 55% instead of ideal 50%. This has a direct impact on the timing margin for DDR/QDR interface, and may significantly reduce memory interface performance.

As with skew, even when care is taken, the duty cycle of a signal may not be consistent for all circuits. For example, in output buffer circuits, pull-up and pull-down transistor drive strength may be balanced or adjusted in order to balance rising and falling edge delays. Because FPGA output buffers often support multiple I/O standards, such as 3.3v, 2.5v, 1.8v, 1.5v, and 1.2v, and also because of PVT (Process, Voltage, and Temperature) variations, it is very hard to balance the rising and falling delays for all I/O standards. For example, if the output buffer is designed to have 50% for 2.5v output, then it may not have a 50% duty cycle for 3.3v, 1.8v, 1.5v, or 1.2v outputs. Accordingly, embodiments of the present invention adjustably vary a difference between the rising and falling edge delay to control the duty cycle.

Another challenge in FPGA output buffer design is simultaneous switching noise (SSN). In applications where there are multiple outputs switching simultaneously, it is desirable to minimize the SSN because SSN causes output jitters, ground bounce, and power sag. The SSN noise is due to noise introduced by package inductance, and cross-talk among signals. SSN noise is equal to L*di/dt, where L is the package inductance, di is the output current change, and dt is the time duration. In this case, it may be desirable to introduce some amount of skew between the simultaneously switching outputs, in order to increase dt to reduce the SSN.

In one conventional interface, in order to adjust an output duty cycle, a delay chain of 150 ps is inserted in front of the PMOS pull-up, and another delay chain of 150 ps is inserted in front of the NMOS pull-down. A pull-up or pull-down may be any type of switch, such as a transistor. Such an exemplary conventional circuit is shown in the next figure.

Figure 2:
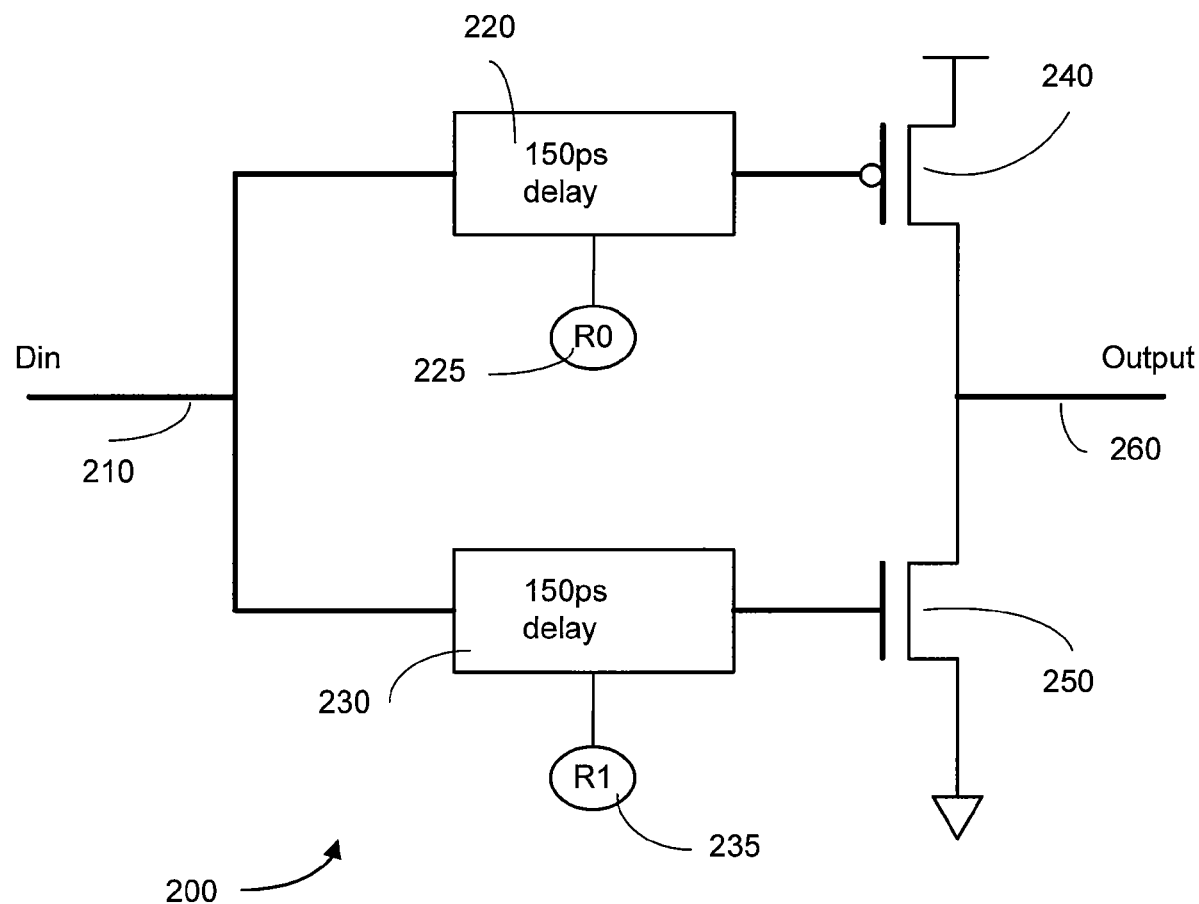
FIG. 2 illustrates an output buffer that may be improved by the incorporation of an embodiment of the present invention.

FIG. 2 illustrates an output buffer 200 that may be improved by the incorporation of an embodiment of the present invention. The delay chain 220 is used to delay the rising edge of a signal, and the delay chain 230 is used to delay the falling edge of a signal. The delay chains 220 and 230 may be turned off by CRAM bits 225 and 235, respectively. Depending on the value of these CRAM bits, the duty cycle may be adjusted to be 150 ps larger or smaller, which is accomplished in the following manner.

In order to delay a rising edge, CRAM bit 235 is set to turn off delay chain 230, and CRAM bit 225 is set to turn on delay chain 220. In a first state, PMOS pull-up 240 is open (off) and the NMOS pull-down is closed (on). Thus, the output signal on line 260 is low, e.g. ground. Then, if a low to high transition of the input signal Din travels along line 210, the high value will reach NMOS pull-down 250 first. However, since delay chain 220 is active, the high value will not reach the PMOS pull-up 240 to turn it "on" until 150 ps have elapsed. Thus, the output signal 260 will remain low for that extra 150 ps, effectively delaying the rising edge, and making the duty cycle smaller. When a high to low transition arrives, it will immediately turn "off" NMOS pull-down 250 since delay chain 230 is not active, thus providing the falling edge without any delay.

In order to delay a falling edge, CRAM bit 225 is set to turn off delay chain 220, and CRAM bit 235 is set to turn on delay chain 230. In a first state, PMOS pull-up 240 is closed (on) and the NMOS pull-down is open (off). Thus, the output signal on line 260 is high. Then, if a high to low transition of the input signal Din travels along line 210, the low value will reach PMOS pull-up 240 first. However, since delay chain 230 is active, the low value will not reach the NMOS pull-down 250 to turn it "on" until 150 ps have elapsed. Thus, the output signal 260 will remain high for that extra 150 ps, effectively delaying the falling edge, and making the duty cycle larger. When a low to high transition arrives, it will immediately turn "off" PMOS pull-up 240 since delay chain 220 is not active, thus providing the falling edge without any delay.

A drawback of this implementation is that it may cause high-Z (high impedance) during transition as both switches are "off" for the value of the delay chain (150 ps in the example above), which is un-desirable. This may be acceptable for some applications where the delay is shorter than the output rise and fall times. However, as these delays become longer, the high-Z state becomes more problematic.

Embodiments of the present invention allow more flexibility in the delay options, e.g. longer delay times, and do not create a high-Z state. Embodiments also have more than one delay setting.

Figure 3:
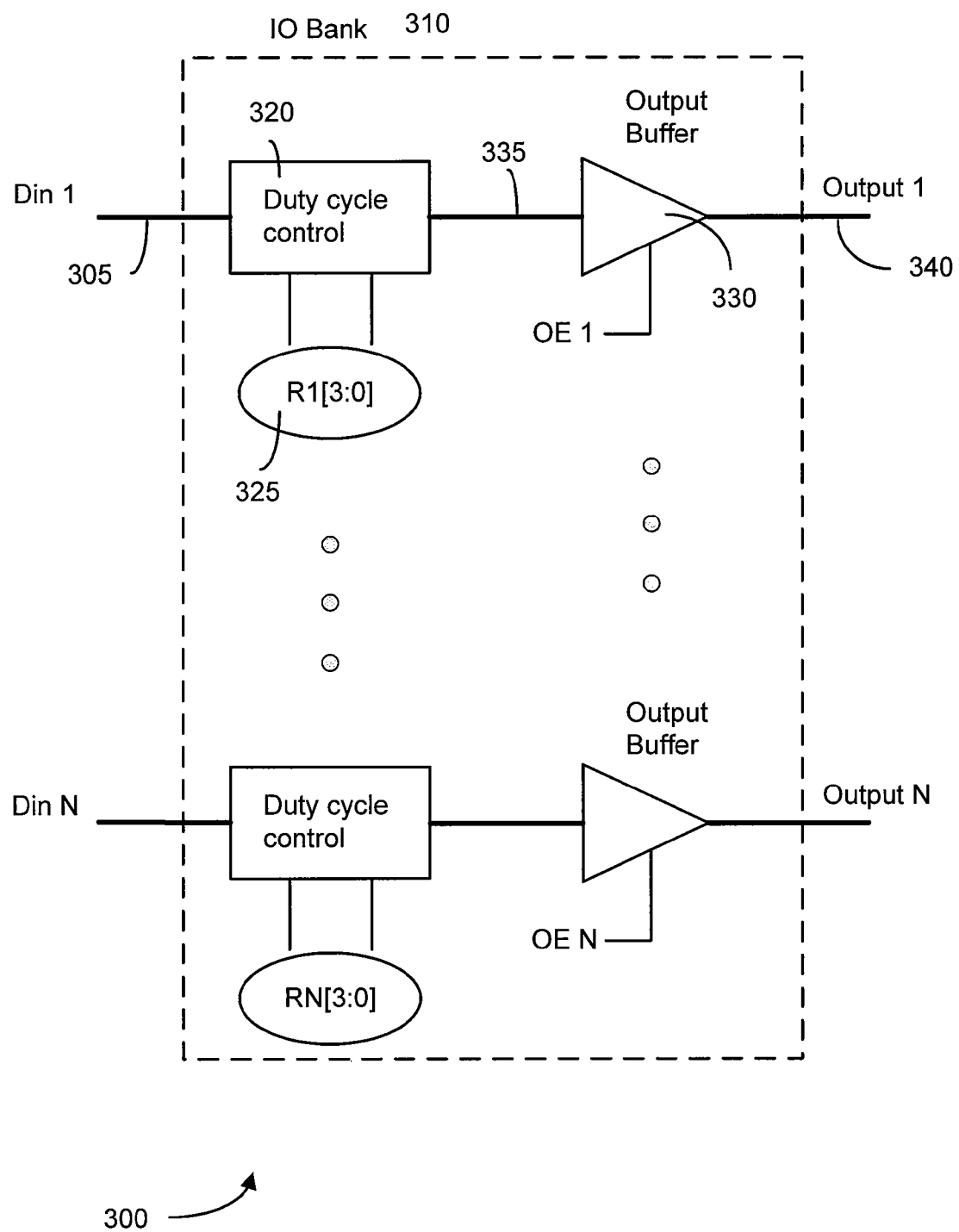
FIG. 3 is a block diagram showing an I/O bank with a duty cycle control circuit inserted in front of an I/O buffer according to an embodiment of the present invention.

FIG. 3 is a block diagram showing an I/O bank 300 with a duty cycle control circuit 320 inserted in front of an I/O buffer 330 according to an embodiment of the present invention. Unlike conventional solutions, a duty cycle control circuit 320 pre-adjusts the duty cycle of an input signal Din on line 305, which is then sent to the I/O buffer 330 on line 335. Since embodiments are applicable to input and output, I/O buffers 330 may be an output buffer or an input buffer. As the pull-up and pull-down transistors in output buffers 330 have the same input, there is no high-Z during transition.

In one embodiment, each duty cycle control circuit 320 is controlled by separate control signals that are derived from respective memory elements 325. In one aspect, there are four RAM bits in each memory element 325. In another embodiment, each duty cycle control circuit 300 is controlled by signals from a skew adjustment control circuitry, which also may adjust the skew between different signals by adjusting a delay within each control circuit 300 and which may control the duty cycle through the control signals.

The control signals are used to program each one of the duty control circuits 300 to delay rising and/or falling edges of a respective Din or not to delay them. The control signals may also be used to select different amounts of delay. In one embodiment with four control bits, there are 13 settings as shown in Table-1.

TABLE 1

RAM Settings for Output Delay Control

| | Delay Settings | R3 | R2 | R1 | R0 |
|---|---|---|---|---|---|
| No delay | 0 ps | 0 | 0 | x | x |
| Delay Rising Edge | 50 ps | 0 | 1 | 0 | 0 |
| | 100 ps | 0 | 1 | 0 | 1 |
| | 150 ps | 0 | 1 | 1 | 0 |
| | 200 ps | 0 | 1 | 1 | 1 |
| Delay Falling Edge | 50 ps | 1 | 0 | 0 | 0 |
| | 100 ps | 1 | 0 | 0 | 1 |
| | 150 ps | 1 | 0 | 1 | 0 |
| | 200 ps | 1 | 0 | 1 | 1 |
| Delay Both Edges | 50 ps | 1 | 1 | 0 | 0 |
| | 100 ps | 1 | 1 | 0 | 1 |
| | 150 ps | 1 | 1 | 1 | 0 |
| | 200 ps | 1 | 1 | 1 | 1 |

Based on their needs, users can independently choose to do four things on the signal Din sent to each I/O buffer 330: (1) no delay; (2) delay rising edge only; (3) delay falling edge only; or (4) delay both rising and falling edges. Users can also choose the amount of delay they need (from 50 ps to 200 ps) for flexibility and optimal results according to Table-1. This flexibility makes control circuits 320 a good choice to be used for aligning output signals 340 by adjusting the delays associated with rising and falling edges, as is described in U.S. patent application "Write-Side Calibration for Data Interface" by Yan Chong et al. Ser. No. 11/735,394.

In one embodiment, duty cycle control circuits 320 can be used to reduce simultaneous switching noise (SSN). For example, if output1, output2, and output3 are switching simultaneously, then some skew can be added among them to reduce the SSN noise. For example, 50 ps may be added to output2, and 100 ps may be added to output3.

I/O to I/O skew (or channel to channel skew) adjustment, as described in "Read-Side Calibration for Data Interface" and "Write-Side Calibration for Data Interface" may also be provided by duty cycle control circuits 320. For example, if output1 has more delay than output2 by 50 ps, then the delay element in output2 can be set to add 50 ps delay into output2, thus balancing the skew between output1 and output2. Additionally, skew may be reduced in a memory system including a memory controller, PCB (Printed Circuit Board), and memory devices. For example, the selection of the appropriate delay in a duty cycle control circuit 320 can be used to compensate skew on package, PCB, or memory devices as well as skew within the device in order to improve the overall timing margin for high speed DDR or QDR memory interfaces.

Figure 4:
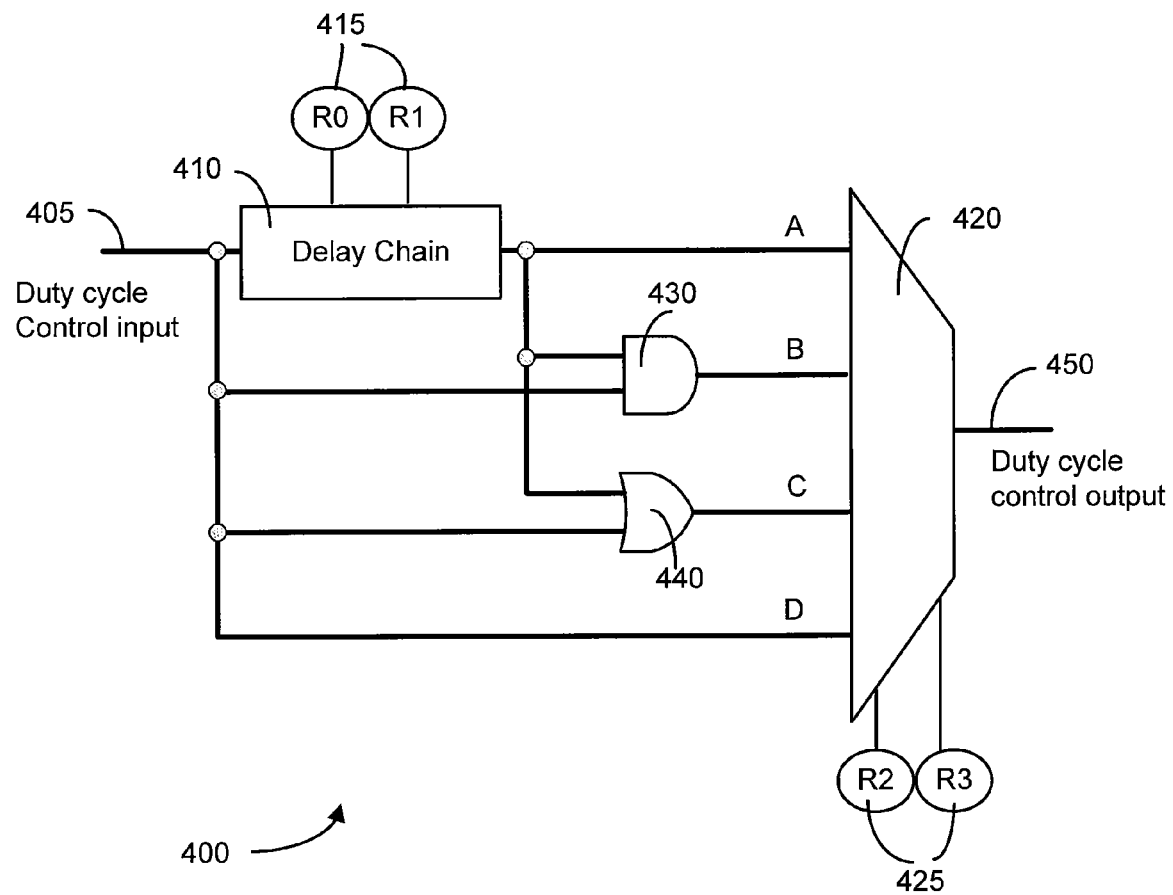
FIG. 4 is a block diagram of a duty cycle control circuit according to an embodiment of the present invention.

FIG. 4 is a block diagram of a duty cycle control circuit 400 according to an embodiment of the present invention. Duty cycle control circuit 400 may be placed anywhere in the output path. In some embodiments, it is advantageous to place duty cycle control circuit 400 as close to the output buffer as possible. Duty cycle control circuit 400 may also be placed within an input path.

In order to provide options of delaying different edges, and combinations thereof, duty cycle control circuit 400 delays an input signal on line 405 according to each option and then selects the desired signal. In one embodiment, the signals of the different delay options include not delaying input signal 405 to create signal D, delaying both rising and falling edges of input signal 405 to create signal A, delaying only the rising edges of input signal 405 to create signal B, and delaying only the falling edges of input signal 405 to create signal C. The desired signal may then be selected by multiplexer (mux) 420, which can be any general signal selection circuit composed of, for example, logic gates, tristate gates, pass gates, or pass devices.

In one embodiment, a single delay chain 410 provides the delay for all of the delay options. In another embodiment, two or more of the optional delayed signals utilize a different delay chain. Delay chain 410 may be programmable, with control signals coming from one or more memory elements, such as 415, or from skew adjustment control circuitry as described in U.S. patent applications "Read-Side Calibration for Data Interface" and "Write-Side Calibration for Data Interface." Accordingly, delay chain 410 delays input signal 405 to create signal A at a first input of mux 420.

In order to provide another delay option, a first logic circuit 430 is used to delay only the rising edges. In one aspect, a delayed signal is used to mark a point of the rising edge, and a non-delayed signal is used to mark a point of the falling edge. In one embodiment, first logic circuit 430 performs an AND function. In this embodiment, circuit 430 may be an AND gate, or any suitable combination of logic gates and/or switches providing an AND function.

Circuit 430 may receive one input from delay chain 410, or from another suitable delay device. Another input of circuit 430 is the non-delayed input signal 405. When performing an AND function, circuit 430 will continue to output a low value even after the input signal 405 makes a transition to a high value because the delayed signal, e.g. from delay chain 410, is still low. Thus, the output signal B from circuit 430 makes the transition to high only after the delayed signal makes the transition to high. For example, when an AND gate is used, the output stays low until both inputs are high. When the input signal 405 makes the transition from high to low, circuit 430 outputs a low value immediately, thus the falling edge is not delayed. For example, when an AND gate is used, the output changes to low when either one of the inputs goes low.

In order to provide another delay option, a second logic circuit 440 is used to delay only the falling edges. In one aspect, the non-delayed signal is used to mark a point of the rising edge, and a delayed signal is used to mark a point of the falling edge. In one embodiment, second logic circuit 440 performs an OR function. In this embodiment, circuit 440 may be an OR gate, or any suitable combination of logic gates and/or switches providing an OR function.

Circuit 440 may receive one input from delay chain 410, or from another suitable delay device. Another input of circuit 440 is the non-delayed input signal 405. When performing an OR function, circuit 440 will continue to output a high value even after the input signal 405 makes a transition to a low value because the delayed signal, e.g. from delay chain 410, is still high. Thus, the output signal C from circuit 440 makes the transition to low only after the delayed signal makes the transition to low. For example, when an OR gate is used, the output stays high until both of the inputs are low. When the input signal 405 makes the transition from low to high, circuit 440 outputs a high value immediately, thus the rising edge is not delayed. For example, when an OR gate is used, the output changes to high when either one of the inputs goes high.

The desired signal from signals A-D may be chosen via control signals at a data select input of mux 420 in order to output on line 450. The control signals may be derived from values stored in one or more memory elements 425, which can be any suitable memory such as CRAM bits. The control signals may also be from skew adjustment control circuitry as mentioned above.

Figure 5:
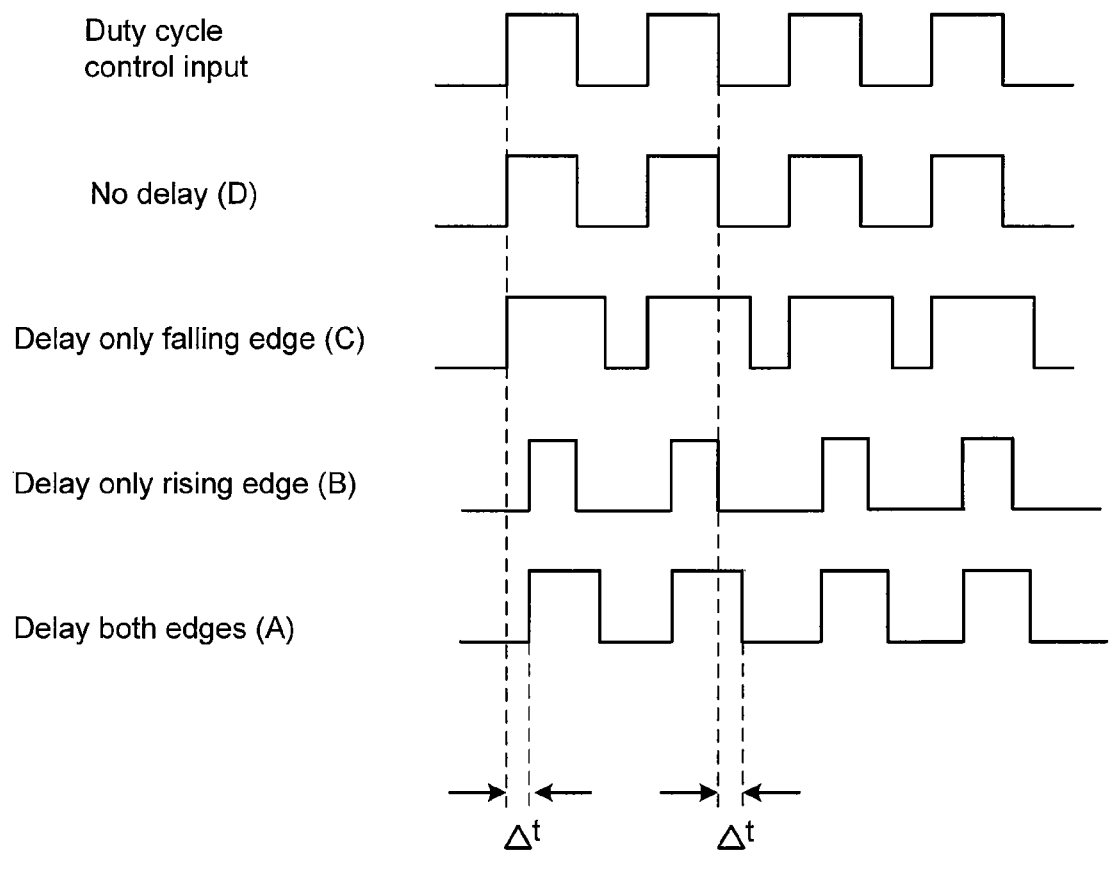
FIG. 5 is a timing diagram illustrating the operation of a duty cycle control circuit according to an embodiment of the present invention.

FIG. 5 is a timing diagram illustrating the operation of a duty cycle control circuit according to an embodiment of the present invention. The input of a duty cycle control circuit, such as circuit 400, is shown in the top timing sequence. The next four timing sequences show four different delay signals A-D, which correspond to the four inputs of mux 420. As shown in the waveforms, the duty cycle of the mux output 450 is adjusted depending on the RAM settings.

The waveform D is identical to the input since this signal is not delayed. The waveform A is the same as the input signal, but shifted by an amount Δt. Since signal A is delayed for both rising and falling edges, both edges of waveform A are shifted by Δt.

The waveform B only has the rising edge delayed. As can be seen from FIG. 5, the rising edge of waveform B corresponds to the rising edge of waveform A, which occurs when only one delay chain is used or the respective delay chains have the same value. In other words, the delayed signal, which is an input into the first logic circuit 430, is used to mark the time for the transition from low to high for the waveform B. The falling edge of the waveform B corresponds to the input signal (and waveform D), and thus the falling edge is not delayed. The input signal is thus used to mark the time for the falling transition.

The waveform C only has the falling edge delayed. As can be seen from FIG. 5, the rising edge of the waveform C corresponds to the input signal (and waveform D), and thus the rising edge is not delayed. The input signal is thus used to mark the time for the rising transition. The falling edge of waveform C corresponds to the falling edge of waveform A, which occurs when only one delay chain is used or the respective delay chains have the same value. The delayed signal, which is an input into the second logic circuit 440, is used to mark the time for the transition from high to low for the waveform C.

Accordingly, by selecting waveforms B or C, the duty cycle of the input signal 405 may be adjusted. For example, if the desired duty cycle is 50% and the actual duty cycle is 45%, then the duty cycle should be increased by selecting waveform C. If the appropriate delay is selected, then the increase will be about 5% and the desired duty cycle is achieved. If the desired duty cycle is 50% and the actual duty cycle is 55%, then the duty cycle should be decreased by selecting waveform B. Again, if the appropriate delay is selected, then the decrease will be about 5% and the desired duty cycle will be achieved. Thus, if the output buffer duty cycle is not 50%, then the duty cycle control circuit can be set to delay either the rising edge or the falling edge by an appropriate amount to adjust the output duty cycle to achieve 50%, as long as the output buffer skew is not more than the maximum delay available (for example: 200 ps).

Figure 6:
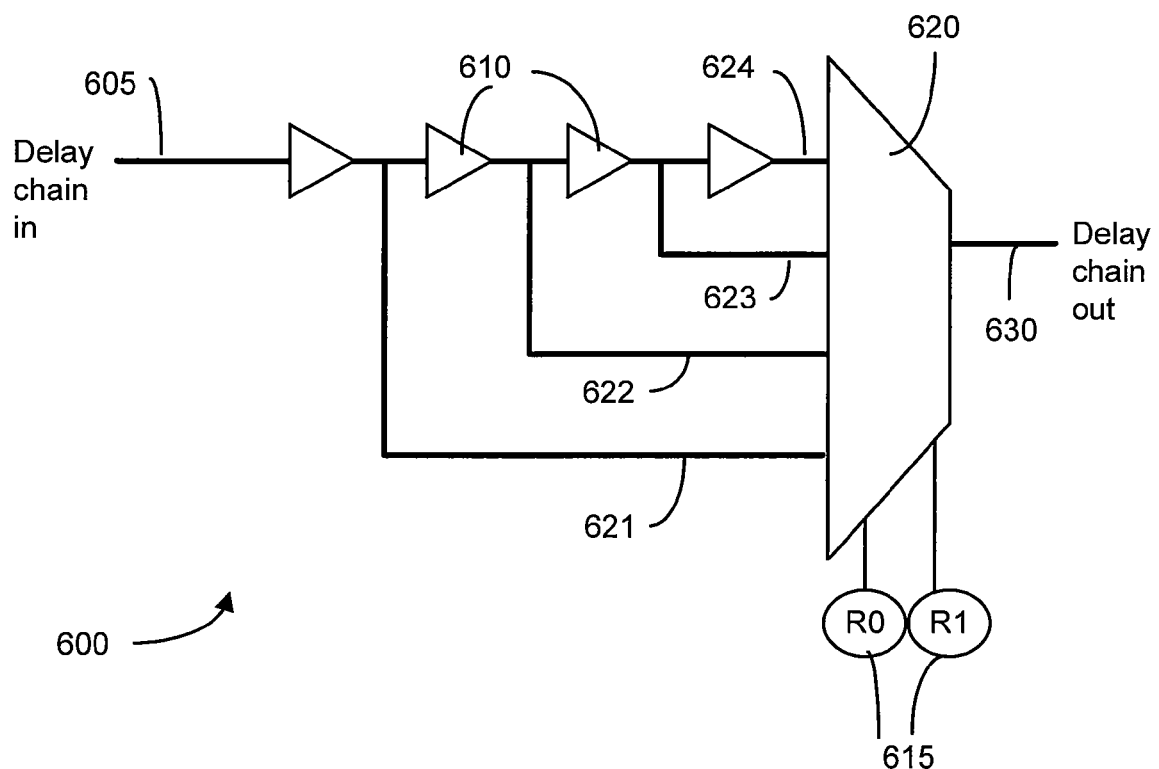
FIG. 6 is a block diagram of a delay chain used in a duty cycle control circuit according to an embodiment of the present invention.

FIG. 6 is a block diagram of a delay chain 600 used in a duty cycle control circuit according to an embodiment of the present invention. Delay chain 600 is a typical implementation of delay chain design with a mux 620 selecting one of four different delay setting. In other embodiments, any number of delay settings may be available. The number of delay settings is determined by the number of delay stages 610. A simple buffer or inverter, current-starved inverters or buffers with high capacitive loads, or any other circuit providing a delay may be used as an element of each delay stage 610.

After a first delay stage, a first delayed output on line 621 is sent to a first input of mux 620. A second and other delay stages typically provide equal amounts of delay. For example, if each delay stage is 50 ps, delays of 50 ps, 100 ps, 150 ps, and 200 ps may be provided. However, in some embodiments different delay stages provide different amount of delay.

In the embodiment depicted in FIG. 6, additional delay stages provide outputs 622, 623, and 624, each with increasing total delay, at respective inputs of mux 620. Control signals derived from one or more memory elements 615 may be used to select one of the delay settings. Control signals from other sources described herein may also be used. Accordingly, the desired delay output 630 is achieved for delaying the appropriate edges of an input signal of a duty cycle control circuit.

Figure 7:
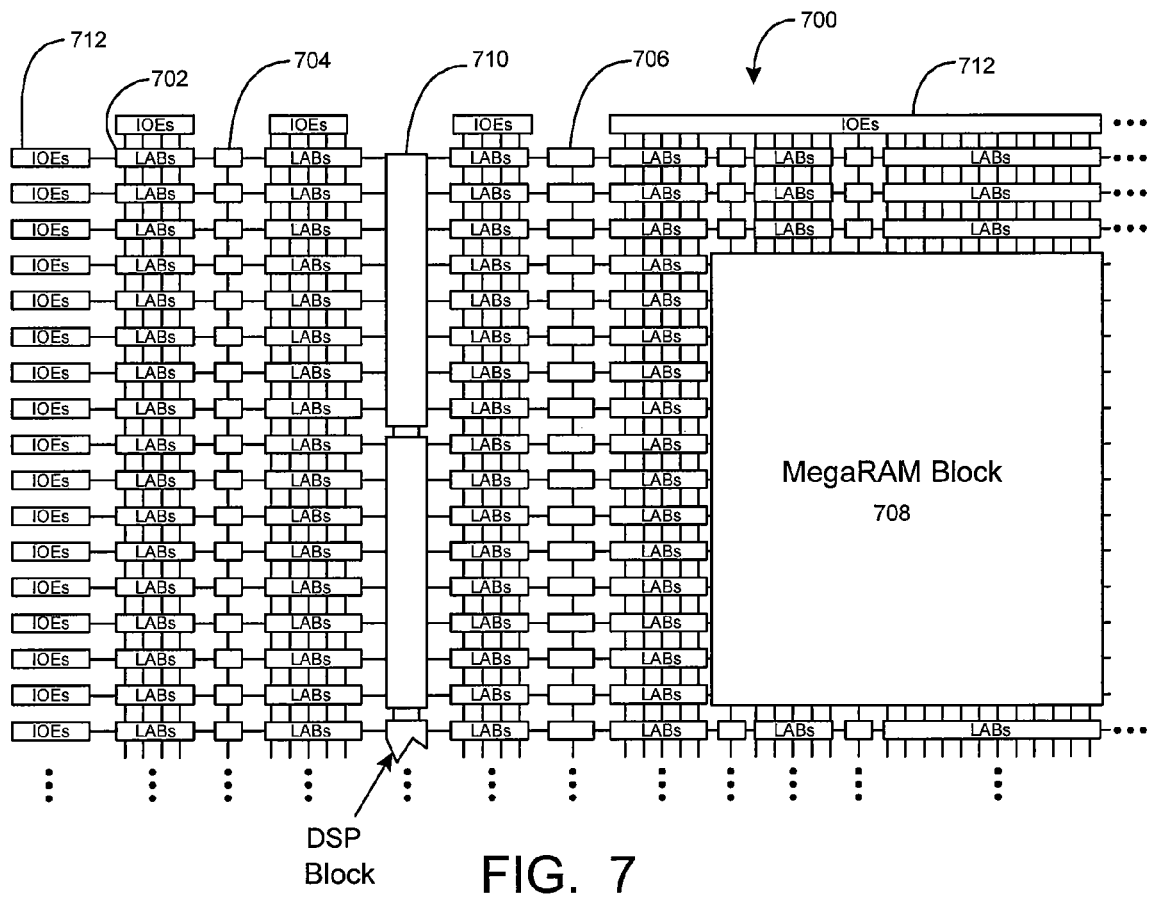
FIG. 7 is a simplified block diagram of a programmable logic device that may benefit by incorporating embodiments of the present invention.

FIG. 7 is a simplified partial block diagram of an exemplary high-density programmable logic device (PLD) 700 wherein techniques according to the present invention can be utilized. PLD 700 includes a two-dimensional array of programmable logic array blocks (or LABs) 702 that are interconnected by a network of column and row interconnections of varying length and speed. LABs 702 include multiple (e.g., 10) logic elements (or LEs), an LE being a small unit of logic that provides for efficient implementation of user defined logic functions.

PLD 700 also includes a distributed memory structure including RAM blocks of varying sizes provided throughout the array. The RAM blocks include, for example, 512 bit blocks 704, 4K blocks 706 and an M-Block 708 providing 512K bits of RAM. These memory blocks may also include shift registers and FIFO buffers. PLD 700 further includes digital signal processing (DSP) blocks 710 that can implement, for example, multipliers with add or subtract features.

PLD 700 also includes input/output elements (IOEs) 712 for providing a communication interface with circuits and devices that are external to PLD 700. These other circuits or devices may reside on another circuit board, a same circuit board, or even the same chip. It is to be understood that PLD 700 is described herein for illustrative purposes only and that the present invention can be implemented in many different types of PLDs, FPGAs, and the other types of digital integrated circuits.

Figure 8:
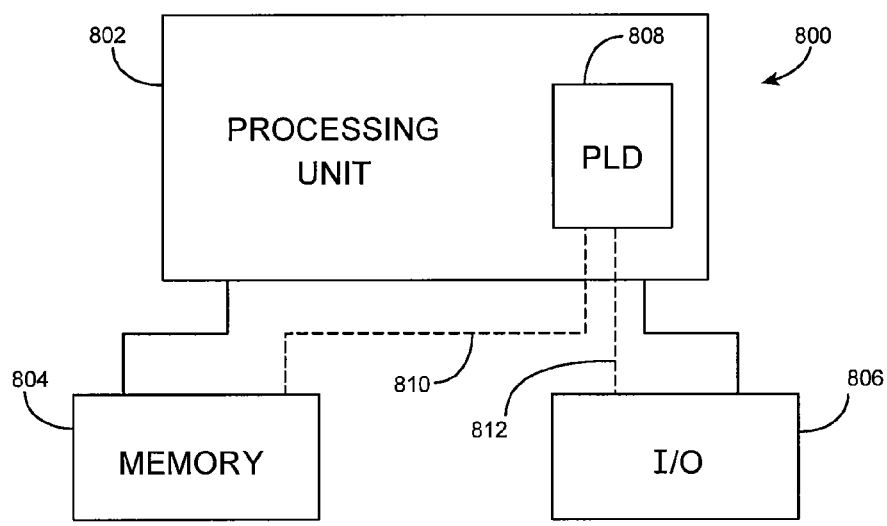
FIG. 8 is a block diagram of an electronic system that may benefit by incorporating embodiments of the present invention.

While PLDs of the type shown in FIG. 7 provide many of the resources required to implement system level solutions, the present invention can also benefit systems wherein a PLD is one of several components. FIG. 8 shows a block diagram of an exemplary digital system 800, within which the present invention may be embodied. System 800 can be a programmed digital computer system, digital signal processing system, specialized digital switching network, or other processing system. Moreover, such systems may be designed for a wide variety of applications such as telecommunications systems, automotive systems, control systems, consumer electronics, personal computers, electronic displays, Internet communications and networking, and others. Further, system 800 may be provided on a single board, on multiple boards, or within multiple enclosures.

System 800 includes a processing unit 802, a memory unit 804 and an I/O unit 806 interconnected together by one or more buses. According to this exemplary embodiment, a programmable logic device (PLD) 808 is embedded in processing unit 802. PLD 808 may serve many different purposes within the system in FIG. 8. PLD 808 can, for example, be a logical building block of processing unit 802, supporting its internal and external operations. PLD 808 is programmed to implement the logical functions necessary to carry on its particular role in system operation. PLD 808 may be specially coupled to memory 804 through connection 810 and to I/O unit 806 through connection 812.

Processing unit 802 may direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 808 can control the logical operations of the system. In an embodiment, PLD 808 acts as a reconfigurable processor, which can be reprogrammed as needed to handle a particular computing task. Alternately, programmable logic device 808 may itself include an embedded microprocessor. Memory unit 804 may be a random access memory (RAM), read only memory (ROM), fixed or flexible disk media, PC Card flash disk memory, tape, or any other storage means, or any combination of these storage means.

Embodiments of the present invention may be used to improve circuits that interface with the memory unit 804. While embodiments of the present invention particularly benefit these interface circuits when memory unit 804 is a double-data rate (DDR) type memory, embodiments may benefit other multiple-data rate types interfaces that are either now known or later developed.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising a duty cycle control circuit, the duty cycle control circuit comprising:
    an input line coupled with a first input of a signal selection circuit;
    a delay chain having an input coupled with the input line and having an output coupled with a second input of the signal selection circuit;
    a first logic having a first input coupled with the input line and having an output coupled with a third input of the signal selection circuit, wherein the first logic is used in delaying only the rising edges of a signal on the input line; and
    a second logic having a first input coupled with the input line and having an output coupled with a fourth input of the signal selection circuit, wherein the second logic is used in delaying only the falling edges of the signal on the input line.

2. The integrated circuit of claim 1 wherein the first logic provides an AND function.

3. The integrated circuit of claim 2 wherein the first logic further includes a second input coupled with the output of the delay chain.

4. The integrated circuit of claim 2 wherein the second logic provides an OR function.

5. The integrated circuit of claim 4 wherein the first logic is an AND gate and the second logic is an OR gate.

6. The integrated circuit of claim 4 wherein the second logic further includes a second input coupled with an output of another delay chain.

7. The integrated circuit of claim 1 wherein the delay chain is programmable to have one of a plurality of delay values.

8. The integrated circuit of claim 1 wherein the duty cycle control circuit resides within a data interface of a field programmable gate array.

9. The integrated circuit of claim 1, further comprising:
a pull-up device; and
a pull-down device,
wherein an output of the signal selection circuit is coupled with an input of the pull-up device and an input of the pull-down device.

10. The integrated circuit of claim 9 wherein the duty cycle control circuit receives one or more control signals from skew adjustment control circuitry that resides in a same integrated circuit as the duty cycle control circuit.

11. The integrated circuit of claim 9 wherein the input/output bank does not cause a high-Z state when either only the rising edges of the signal are delayed or only the falling edges of the signal are delayed.

12. A method of delaying a signal, the method comprising:
transmitting a first signal to a first input of a signal selection circuit;
delaying both rising and falling edges of the first signal to form a second signal;
transmitting the second signal to a second input of the signal selection circuit;
delaying only the rising edges of the first signal to form a third signal;
transmitting the third signal to a third input of the signal selection circuit;
delaying only the falling edges of the first signal to form a fourth signal;
transmitting the fourth signal to a fourth input of the signal selection circuit; and
selecting one of the four signals to output from the signal selection circuit.

13. The method of claim 12 wherein delaying only the rising edges of the first signal to form a third signal comprises:
transmitting the first signal to a first input of a first logic that provides an AND function;
transmitting the second signal to a second input of the first logic; and
outputting the third signal from the first logic.

14. The method of claim 12 wherein delaying only the falling edges of the first signal to form a fourth signal comprises:
transmitting the first signal to a first input of a second logic provides an OR function;
transmitting the second signal to a second input of the second logic; and
outputting the fourth signal from the second logic.

15. The method of claim 12, further comprising:
transmitting the output signal of the signal selection circuit to an output buffer.

16. The method of claim 12 wherein selecting one of the four signals to output from the signal selection circuit is based on one or more control signals at a signal select input of the signal selection circuit.

17. The method of claim 16 wherein the control signals are derived from configuration bits stored in a memory element.

18. The method of claim 12 wherein a delay value of the delay chain is programmable based upon a control signal received from skew adjustment control adjustment circuitry in the integrated circuit.

19. The method of claim 12 wherein the first signal is an input signal received at a data interface.

20. The method of claim 12 wherein the signal selection device is a multiplexer.

* * * * *